United States Patent
Wu et al.

(10) Patent No.: US 9,048,233 B2
(45) Date of Patent: Jun. 2, 2015

(54) PACKAGE SYSTEMS HAVING INTERPOSERS

(75) Inventors: Wei-Cheng Wu, Hsinchu (TW); Shang-Yun Hou, Jubei (TW); Shin-Puu Jeng, Hsinchu (TW); Chen-Hua Yu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 584 days.

(21) Appl. No.: 12/787,661

(22) Filed: May 26, 2010

(65) Prior Publication Data

US 2011/0291288 A1    Dec. 1, 2011

(51) Int. Cl.
| | |
|---|---|
| H01L 21/00 | (2006.01) |
| H01L 23/498 | (2006.01) |
| H01L 25/065 | (2006.01) |
| H01L 25/00 | (2006.01) |
| H01L 23/31 | (2006.01) |

(52) U.S. Cl.
CPC ........ *H01L 23/49833* (2013.01); *H01L 23/3128* (2013.01); *H01L 23/49816* (2013.01); *H01L 23/49827* (2013.01); *H01L 25/0652* (2013.01); *H01L 25/0655* (2013.01); *H01L 25/50* (2013.01); *H01L 2224/16227* (2013.01); *H01L 2924/15311* (2013.01); *H01L 2224/16225* (2013.01); *H01L 2924/01019* (2013.01); *H01L 2924/10253* (2013.01); *H01L 2924/1305* (2013.01)

(58) Field of Classification Search
CPC .................. H01L 23/49833; H01L 23/49827; H01L 25/0655; H01L 25/50; H01L 25/0652; H01L 2924/1305; H01L 2924/10253; H01L 2924/01019; H01L 2224/16225; H01L 23/49816; H01L 23/3128; H01L 2224/16227; H01L 2924/15311
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |

(Continued)

FOREIGN PATENT DOCUMENTS

| | | |
|---|---|---|
| CN | 1879213 | 12/2006 |
| CN | 101395978 | 3/2009 |

OTHER PUBLICATIONS

Office Action from corresponding application No. CN 201010581306.2.

*Primary Examiner* — Laura Menz
(74) *Attorney, Agent, or Firm* — Lowe Hauptman & Ham, LLP

(57) ABSTRACT

A package system includes an integrated circuit disposed over an interposer. The interposer includes a first interconnect structure. A first substrate is disposed over the first interconnect structure. The first substrate includes at least one first through silicon via (TSV) structure therein. A molding compound material is disposed over the first interconnect structure and around the first substrate. The integrated circuit is electrically coupled with the at least one first TSV structure.

19 Claims, 11 Drawing Sheets

(56) References Cited

U.S. PATENT DOCUMENTS

| | | | |
|---|---|---|---|
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,358,607 B2 | 4/2008 | Figueroa et al. | |
| 7,659,609 B2 * | 2/2010 | Ha et al. | 257/686 |
| 7,923,290 B2 * | 4/2011 | Ko et al. | 438/106 |
| 8,035,218 B2 | 10/2011 | Guzek et al. | |
| 8,063,475 B2 * | 11/2011 | Choi et al. | 257/686 |
| 8,105,875 B1 * | 1/2012 | Hu et al. | 438/107 |
| 8,115,292 B2 * | 2/2012 | Toh et al. | 257/686 |
| 8,269,337 B2 * | 9/2012 | Hu et al. | 257/700 |
| 8,319,349 B2 * | 11/2012 | Hu et al. | 257/774 |
| 8,709,865 B2 * | 4/2014 | Hu et al. | 438/106 |
| 8,759,150 B2 * | 6/2014 | Hu et al. | 438/107 |
| 8,810,024 B2 * | 8/2014 | Lin et al. | 257/698 |
| 8,828,848 B2 * | 9/2014 | Lin et al. | 438/464 |
| 8,936,966 B2 * | 1/2015 | Hung et al. | 438/106 |
| 2003/0047809 A1 | 3/2003 | Takeuchi et al. | |
| 2005/0208705 A1 * | 9/2005 | Iijima et al. | 438/108 |
| 2006/0046464 A1 | 3/2006 | Miura et al. | |
| 2006/0278968 A1 | 12/2006 | Yamano | |
| 2007/0178686 A1 | 8/2007 | Honda | |
| 2007/0222050 A1 * | 9/2007 | Lee et al. | 257/678 |
| 2007/0256858 A1 * | 11/2007 | Kariya et al. | 174/260 |
| 2008/0116923 A1 | 5/2008 | Cheng et al. | |
| 2008/0180123 A1 | 7/2008 | Cheng et al. | |
| 2008/0318361 A1 * | 12/2008 | Han et al. | 438/109 |
| 2009/0245724 A1 | 10/2009 | Koizumi et al. | |
| 2009/0293271 A1 | 12/2009 | Tanaka | |
| 2010/0084175 A1 | 4/2010 | Suzuki et al. | |
| 2010/0133704 A1 * | 6/2010 | Marimuthu et al. | 257/778 |
| 2010/0140815 A1 * | 6/2010 | Marimuthu et al. | 257/787 |
| 2010/0193928 A1 * | 8/2010 | Zudock et al. | 257/686 |
| 2010/0237477 A1 * | 9/2010 | Pagaila et al. | 257/660 |
| 2010/0308443 A1 * | 12/2010 | Suthiwongsunthorn et al. | 257/621 |
| 2011/0024888 A1 * | 2/2011 | Pagaila et al. | 257/686 |
| 2011/0074004 A1 * | 3/2011 | Shen et al. | 257/690 |
| 2011/0140247 A1 * | 6/2011 | Pagaila et al. | 257/659 |
| 2011/0204505 A1 * | 8/2011 | Pagaila et al. | 257/686 |
| 2011/0254160 A1 | 10/2011 | Tsai et al. | |
| 2011/0266693 A1 * | 11/2011 | Simmons-Matthews | 257/774 |
| 2011/0278741 A1 * | 11/2011 | Chua et al. | 257/777 |
| 2011/0291288 A1 * | 12/2011 | Wu et al. | 257/774 |
| 2012/0104578 A1 * | 5/2012 | Hu et al. | 257/666 |
| 2012/0146209 A1 * | 6/2012 | Hu et al. | 257/692 |
| 2012/0238057 A1 * | 9/2012 | Hu et al. | 438/107 |
| 2013/0040427 A1 * | 2/2013 | Hu et al. | 438/122 |
| 2014/0210101 A1 * | 7/2014 | Lin et al. | 257/774 |

* cited by examiner

PACKAGE SYSTEMS HAVING INTERPOSERS

RELATED APPLICATIONS

The present application is related to U.S. patent application Ser. No. 12/781,960, entitled "PACKAGE SYSTEMS HAVING INTERPOSERS," filed on May 18, 2010, which is incorporated herein by reference in its entirety.

TECHNICAL FIELD

The present disclosure relates generally to the field of semiconductor package systems, and more particularly, to package systems having interposers.

BACKGROUND OF THE DISCLOSURE

Since the invention of integrated circuits, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Conventional methods for forming 3D IC also include die-to-wafer bonding, wherein separate dies are bonded to a common wafer. An advantageous feature of the die-to-wafer bonding is that the size of the dies may be smaller than the size of chips on the wafer.

Recently, through-silicon-vias (TSVs), also referred to as through-wafer vias, are increasingly used as a way of implementing 3D IC. Conventionally, a bottom wafer is bonded to a top wafer. Both wafers include integrated circuits over substrates. The integrated circuits in the bottom wafer are connected to the integrated circuits in the wafer through interconnect structures. The integrated circuits in the wafers are further connected to external pads through through-silicon-vias. The stacked wafers can be subjected to a sawing process to provide a plurality of stacked die structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
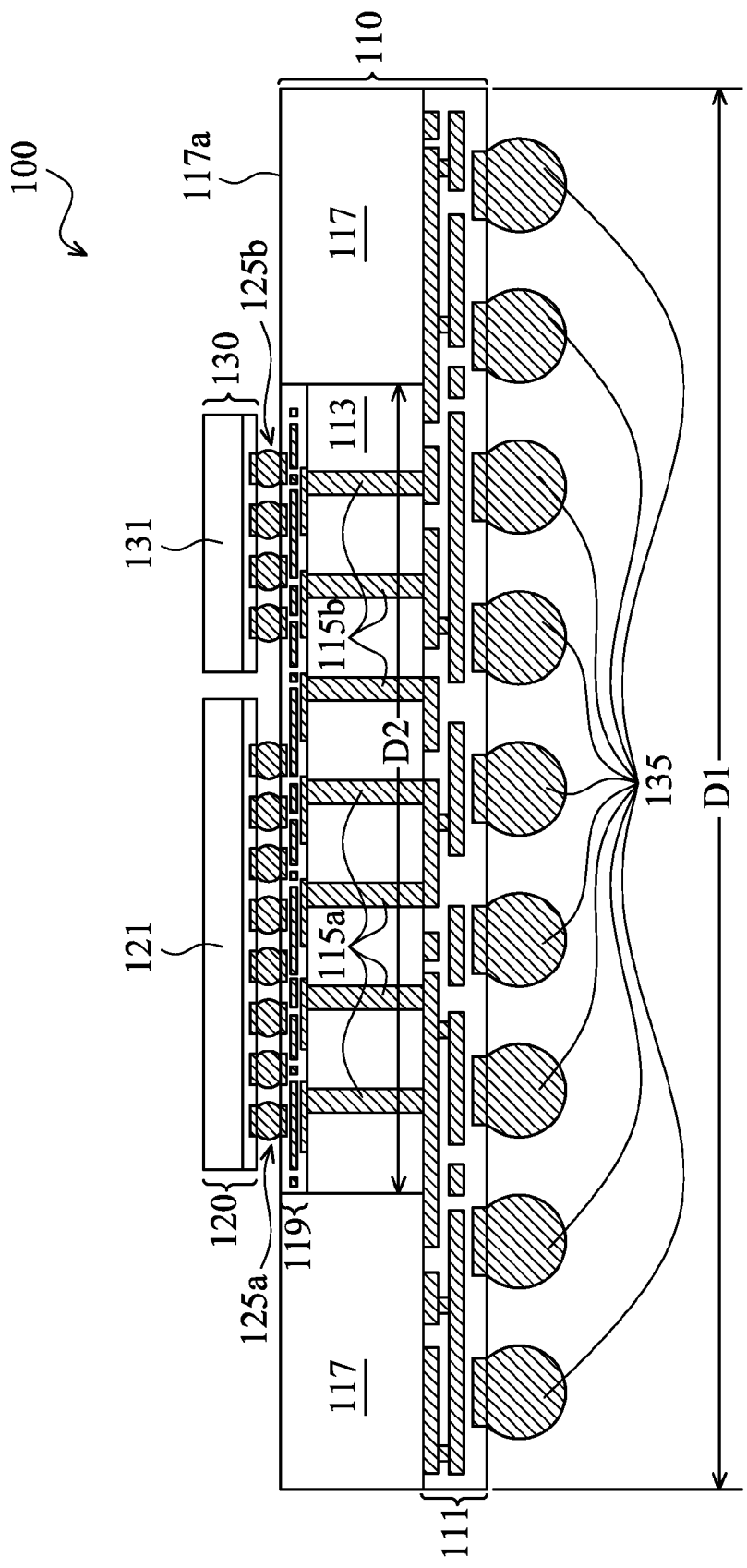
FIG. 1 is a schematic cross-sectional view of a first exemplary package system.

A package system has a silicon die directly disposed on an organic substrate that is disposed on a motherboard. The organic substrate serves as an intermediate apparatus to fan out the metal pitch of the silicon die to the metal pitch of the motherboard. It is found that a coefficient of thermal expansion (CTE) mismatch exists between the silicon die and the organic substrate. The CTE mismatch may result in an intermetal dielectric (IMD) layer delamination of the silicon die and/or a bump failure during an assembly process and/or a reliability test.

To solve the problem, a silicon interposer is disposed between the silicon die and the organic substrate, serving as another transition apparatus. The use of the silicon interposer increases the cost of manufacturing the package system. It is also found that the height of the package system with the silicon interposer is increased, too.

Based on the foregoing, package systems for integrated circuits are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Embodiments of the present application relate to package systems having various interposers. The interposers can each have a molding compound material disposed around side edges of a substrate. The molding compound material can provide a surface area such that a fine metallic line pitch of an interconnect structure disposed on a surface of the substrate can be fanned out to a large metallic line pitch of an interconnect structure disposed on an opposite surface of the substrate. By using the interposer, the organic substrate used in the conventional package system can be saved.

FIG. 1 is a schematic cross-sectional view of a first exemplary package system. In FIG. 1, a package system can include at least one integrated circuit, e.g., integrated circuits 120 and 130, disposed over an interposer 110. The integrated circuits 120 and 130 can be electrically coupled with the interposer 110.

The interposer 110 can include an interconnect structure 111. A substrate 113 can be disposed over the interconnect structure 111. The substrate 113 can include at least one through silicon via (TSV) structures, e.g., TSV structures 115a and 115b, therein. A molding compound material 117 can be disposed over the interconnect structure 111 and around the substrate 113. In some embodiments, the interposer 110 can include at least one passive device, e.g., capacitor, resistor, and/or inductor. In other embodiments, the interposer 110 can be substantially free from including any active device, e.g., metal-oxide-semiconductor (MOS) transistors, bipolar junction transistors (BJTs), complementary MOS (CMOS) transistors, etc.

In some embodiments, the interconnect structure 111 can include at least one dielectric layer and at least one electrical connection structure. In some embodiments, the interconnect structure 111 can include multiple dielectric layers and multiple layers of electrical connection structures. Each layer of the electrical connection structures can be sandwiched by the dielectric layers. In some embodiments, the dielectric layers and the conductive structures can be configured to form various passive devices, e.g., capacitors, resistors, and/or inductors.

In some embodiments, the dielectric layer (not labeled) may include at least one material, such as silicon oxide, silicon nitride, silicon oxynitride, low dielectric constant (low-k) dielectric material, ultra low-k dielectric material, another dielectric material, or any combinations thereof. The electrical connection structures can include at least one structure, such as via plugs, contact plugs, damascene structures, dual damascene structures, metallic regions, metallic lines, or any combinations thereof. The via plugs, contact plugs, damascene structures, dual damascene structures, metallic regions, and metallic lines (not labeled) can be made of at least one material, such as tungsten, aluminum, copper, titanium, tantalum, titanium nitride, tantalum nitride, nickel silicide, cobalt silicide, other proper conductive materials, and/or combinations thereof. In some embodiments, the interconnect structure 111 can have a dimension "D1" in the cross-sectional view shown in FIG. 1. The metallic lines of the interconnect structure 111 has a pitch width.

In some embodiments, the interconnect structure 111 can include at least one pad (not labeled) that can be disposed on a surface of the interconnect structure 111. At least one connector, e.g., bumps 135, can each be disposed over its corresponding pad for electrical connection with one or more substrates (not shown). The at least one pad may be made of at least one material, such as copper (Cu), aluminum (Al), aluminum copper (AlCu), aluminum silicon copper (AlSiCu), or other conductive material or various combinations thereof. In some embodiments, the at least one pad may include an under bump metallization (UBM) layer.

In some embodiments, the bumps 135 can include at least one material, such as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof.

As noted, the substrate 113 can be disposed over the interconnect structure 111. The substrate 113 can be made of an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI). In some examples, the semiconductor substrate may include a doped epi layer or a buried layer. In other examples, the compound semiconductor substrate may have a multi-layer structure, or the substrate may include a multilayer compound semiconductor structure.

The TSV structures 115a and 115b can be disposed in the substrate 113. The TSV structures 115a and 115b can be electrically coupled with the integrated circuits 120 and 130 through connectors, e.g., bumps 125a and 125b, respectively. In some embodiments, the TSV structures 115a and 115b can be made of at least one material, such as a barrier material (e.g., titanium, titanium-nitride, tantalum, tantalum-nitride, other barrier material, and/or any combinations thereof), conductive material (aluminum, copper, aluminum-copper, poly-silicon, other conductive material, and/or any combinations thereof), other materials that are suitable for forming the TSV structures 115a and 115b, and/or combinations thereof.

Referring to FIG. 1, the molding compound material 117 can be disposed around the substrate 113. In some embodiments, the molding compound material 117 can be made of at least one material, such as a polymer-based material. The term "polymer" can represent thermosetting polymers, thermoplastic polymers, or any mixtures thereof. The polymer-based material can include, for example, plastic materials, epoxy resin, polyimide, PET (polyethylene terephthalate), PVC (polyvinyl chloride), PMMA (polymethylmethacrylate), polymer components doped with specific fillers including fiber, clay, ceramic, and inorganic particles, or any combinations thereof. In other embodiments, the molding compound material 117 can be made of epoxy resin, such as epoxy cresol novolac (ECN), biphenyl epoxy resin, multi-functional liquid epoxy resin, or any combinations thereof. In still other embodiments, the molding compound material 117 can be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof.

In some embodiments, the interposer 110 can include another interconnect structure 119 disposed over the substrate 113. The TSV structures 115a and 115b can be electrically coupled with the integrated circuits 120 and 130 through the interconnect structure 119 and the bumps 125a and 125b. The interconnect structure 119 can include at least one dielectric layer, via plugs, contact plugs, damascene structures, dual damascene structures, metallic regions, metallic lines, passivation materials, other semiconductor materials, or any combinations thereof. In some embodiments, the dielectric layer and the conductive structures can be configured to form various passive devices, e.g., capacitors, resistors, and/or inductors.

The dielectric layer (not labeled) may include at least one material, such as silicon oxide, silicon nitride, silicon oxynitride, low-k dielectric material, ultra low-k dielectric material, other dielectric materials, or any combinations thereof. The via plugs, contact plugs, damascene structures, dual damascene structures, metallic regions, and metallic lines (not labeled) can be made of at least one material, such as tungsten, aluminum, copper, titanium, tantalum, titanium nitride, tantalum nitride, nickel silicide, cobalt silicide, other proper conductive materials, and/or combinations thereof.

In some embodiments, the bumps 125a and 125b can be made of at least one material, such as a lead-free alloy (such as gold (Au) or a tin/silver/copper (Sn/Ag/Cu) alloy), a lead-containing alloy (such as a lead/tin (Pb/Sn) alloy), copper, aluminum, aluminum copper, conductive polymer, other bump metal materials, and/or combinations thereof.

In some embodiments, the interconnect structure 119 can have a dimension "D2" in the cross-sectional view shown in FIG. 1. The dimension "D2" of the interconnect structure 119 is smaller than the dimension "D1" of the interconnect structure 111. In other embodiments, the metallic lines of the interconnect structure 119 has a pitch width. The metallic line pitch of the interconnect structure 119 can be smaller than the metallic line pitch of the interconnect structure 111. In an embodiment, the surface 117a of the molding compound material 117 can be substantially level with the surface 119a of the interconnect structure 119. In other embodiments, the surface 117a of the molding compound material 117 can be lower or higher than the surface 119a of the interconnect structure 119.

In some embodiments, the interconnect structure 119 can include at least one pad (not labeled) that can be disposed on a surface of the interconnect structure 119. The bumps 125a and 125b can each be disposed over its corresponding pad. In some embodiments, the pitch of the bumps 125a and 125b can be smaller than the pitch of the bumps 135. The at least one pad may comprise at least one material such as copper (Cu), aluminum (Al), aluminum copper (AlCu), aluminum silicon copper (AlSiCu), or other conductive material or various combinations thereof. In some embodiments, the at least pad may include an under bump metallization (UBM) layer.

Referring again to FIG. 1, at least one integrated circuit, e.g., the integrated circuits 120 and 130, can be disposed over the interposer 110. The integrated circuits 120 and 130 can include substrates 121 and 131, respectively. The substrates 121 and 131 can each be similar to the substrate 113 described above. In some embodiments, each coefficient of thermal expansion (CTE) of the substrates 121 and 131 can be substantially equal to the CTE of the substrate 113. The phrase "each coefficient of thermal expansion (CTE) of the substrates 121 and 131 can be substantially equal to the CTE of the substrate 113" can represent that the CTE mismatch between the substrates does not result in a low-k intermetal dielectric (IMD) layer delamination of the integrated circuits 120 and 130 and/or a bump failure of the bumps 125a and 125b during an assembly process and/or a reliability test. Though merely showing two integrated circuits disposed over the interposer 110, the scope of this application is not limited thereto. In some embodiments, a single integrated circuit or more than two integrated circuits can be horizontally separated and/or vertically stacked over the interposer 110.

In FIG. 1, the integrated circuits 120 and 130 can each include an interconnect structure (not labeled) disposed between the substrates 121, 131 and bumps 125a, 125b, respectively. The integrated circuits 120 and 130 can each include various active devices. In some embodiments, the interconnect structures of the integrated circuits 120 and 130 can each be similar to the interconnect structure 111 or 119 described above. In some embodiments, the metallic lines of the interconnect structures of the integrated circuits 120 and 130 can have a pitch width. The metallic line pitch of the integrated circuits 120 and 130 can be smaller than the metallic line pitch of the interconnect structure 119. In other embodiments, the metallic line pitch of at least one of the integrated circuits 120 and 130 can be substantially equal to the metallic line pitch of the interconnect structure 119.

In some embodiments, the interconnect structures of the integrated circuits 120 and 130 can each include at least one pad (not labeled) that can be disposed on a surface of the interconnect structure. The bumps 125a and 125b can each be electrically coupled with its corresponding pad. The at least one pad may comprise at least one material such as copper (Cu), aluminum (Al), aluminum copper (AlCu), aluminum silicon copper (AlSiCu), or other conductive material or various combinations thereof. In some embodiments, the at least pad may include an under bump metallization (UBM) layer.

As noted, the interposer 110 can have a fine metallic line pitch on the interconnect structure 119 and a large metallic line pitch on the interconnect structure 111. The interposer 110 can fan out the pitch of the bumps 125a and 125b to the pitch of the bumps 135 through the interconnect structure 119, the TSV structures 115a, 115b, and the interconnect structure 111. Since the interconnect structure 111 has a larger dimension "D1" than the dimension "D2" of the interconnect structure 119, the interconnect structure 111 can have more bumps 135 and accommodate more pin counts thereon.

It is also noted that since each CTE of the substrates 121 and 131 is substantially equal to the CTE of the substrate 113, the CTE mismatch among the substrates 121, 131, and 113 can be reduced. In some embodiments, the package system 100 can be free from including any organic substrate that acts as an intermediate transformer between a motherboard and a die of a conventional package system. The cost of using the conventional organic substrate can be thus reduced. The concern resulting from the organic substrate and the substrate of the die can also be eliminated.

Figure 2:
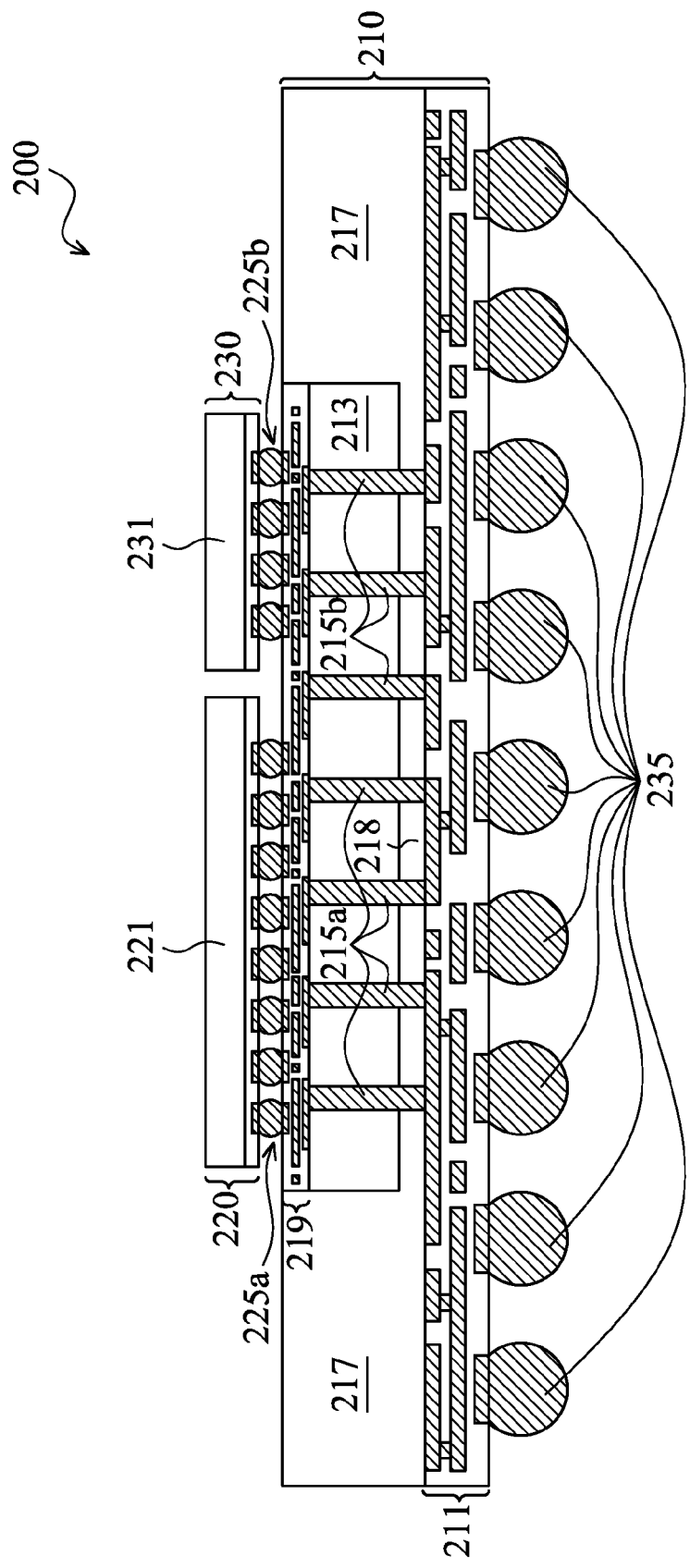
FIG. 2 is a schematic cross-sectional view of a second exemplary package system.

FIG. 2 is a schematic cross-sectional view of a second exemplary package system. Items of FIG. 2 that are the same or similar items in FIG. 1 are indicated by the same reference numerals, increased by 100. In FIG. 2, a package system 200 can include a molding compound layer 218 disposed between an interconnect structure 211 and a substrate 213. TSV structures 215a and 215b are disposed through the molding compound layer 218 for electrically coupling the interconnect structure 211.

Though divided by the TSV structures 215a and 215b as shown in the cross-sectional view of FIG. 2, in some embodiments, the molding compound layer 218 can continuously extend from the left molding compound material 217 to the right molding compound material 217 in a top view of the package system 200. The molding compound layer 218 can be made of at least one material that is the same or similar to the molding compound material 117 described above in conjunction with FIG. 1.

Figure 3:
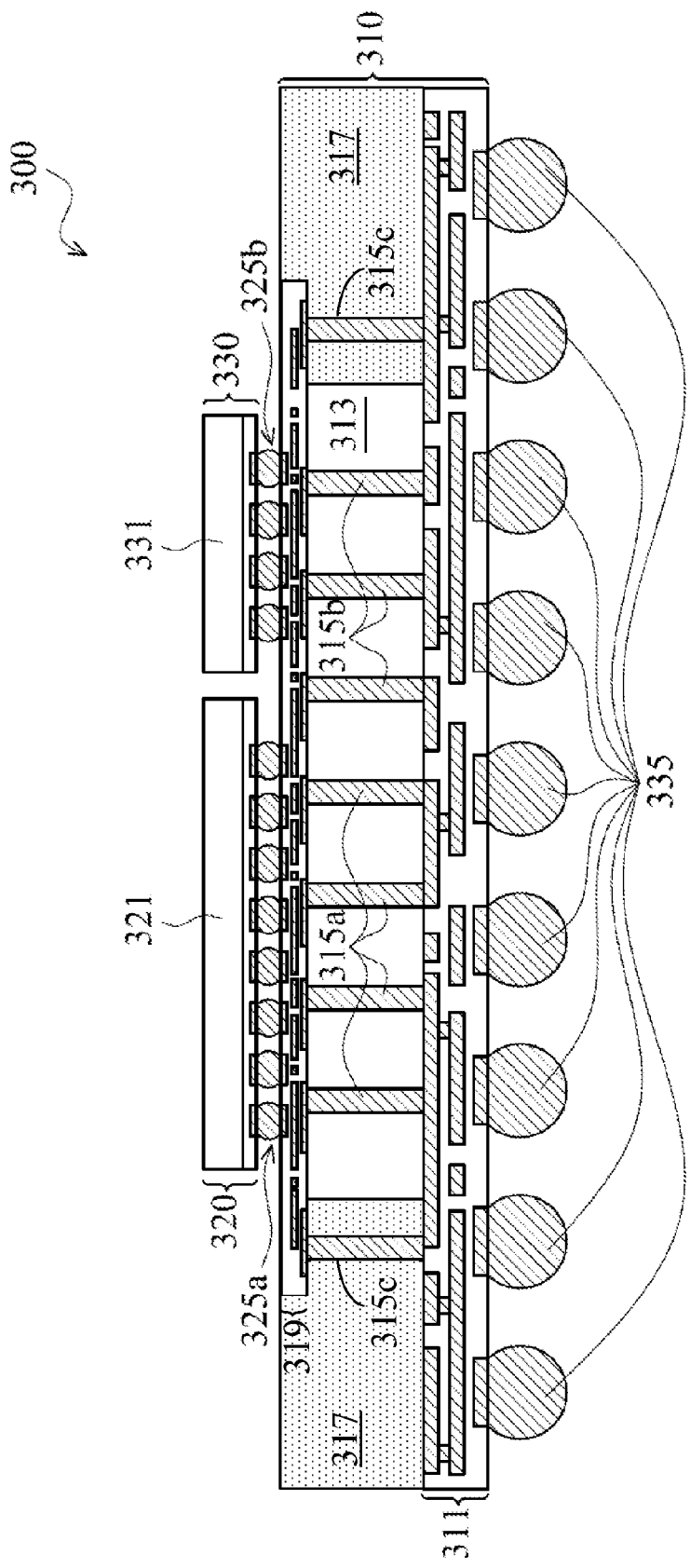
FIG. 3 is a schematic cross-sectional view of a third exemplary package system.

FIG. 3 is a schematic cross-sectional view of a third exemplary package system. Items of FIG. 3 that are the same or similar items in FIG. 1 are indicated by the same reference numerals, increased by 200. In FIG. 3, a portion of an interconnect structure 319 can extend over at least a portion of a molding compound material 317. The molding compound material 317 can include at least one TSV structure, e.g., TSV structures 315c, therein. The TSV structures 315c can be made of at least one material that is the same or similar to that of the TSV structures 115a and 115b described above in conjunction with FIG. 1. The interconnect structure 319 can be at least partially electrically coupled with an interconnect structure 311 through the TSV structures 315c.

By extending the interconnect structure 319 at least partially over the molding compound material 317, the dimension and/or area of the interconnect structure 319 can be increased. The interconnect structure 319 can accommodate larger and/or more integrated circuits thereover. The package capacity of the package system 300 can thus be increased. In some embodiments, the molding compound layer 218 (shown in FIG. 2) can be disposed between the interconnect structure 311 and the substrate 313.

Figure 4:
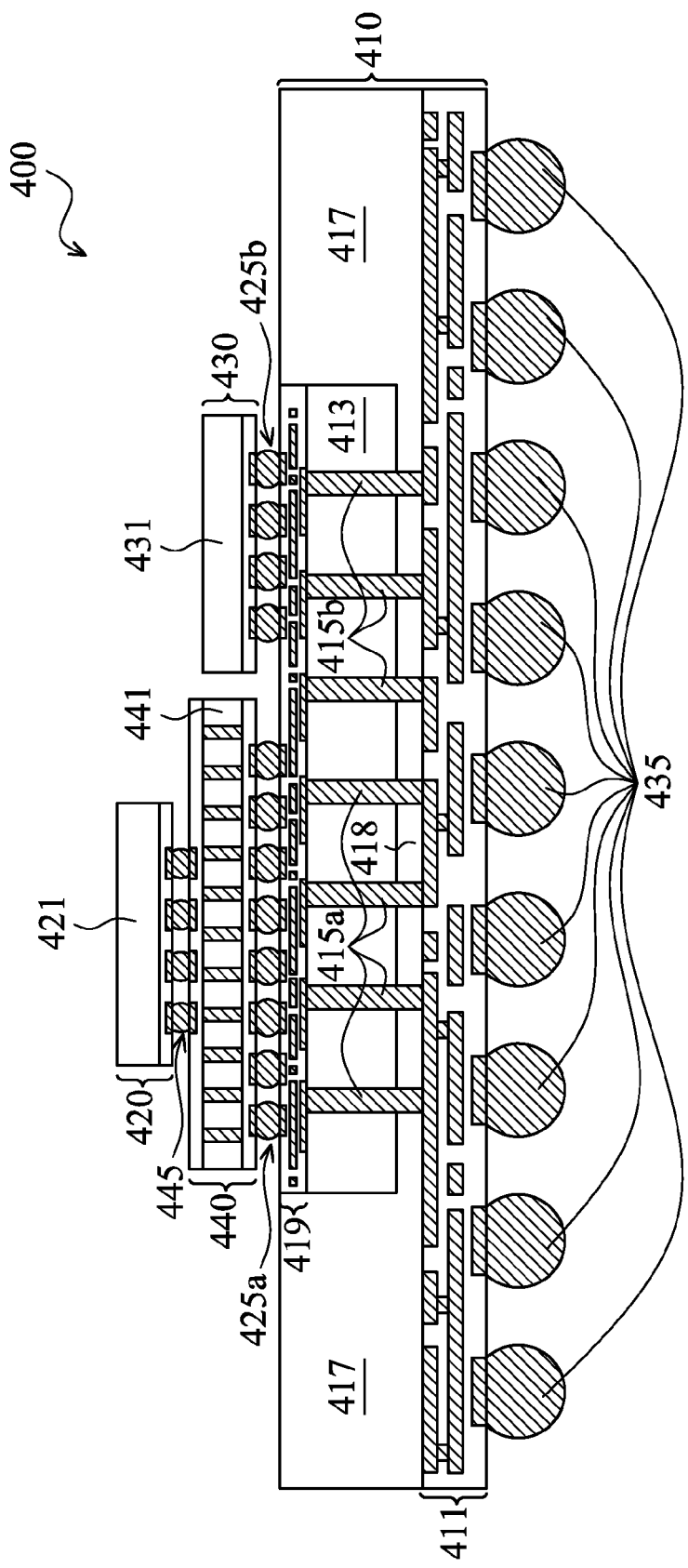
FIG. 4 is a schematic cross-sectional view of a fourth exemplary package system.

FIG. 4 is a schematic cross-sectional view of a fourth exemplary package system. Items of FIG. 4 that are the same or similar items in FIG. 2 are indicated by the same reference numerals, increased by 200, respectively. In FIG. 4, another interposer 440 can be disposed between an interposer 410 and an integrated circuit 420.

In some embodiments, the interposer 440 can include a substrate 441 that is disposed between interconnect structures (not labeled). The interconnect structures of the interposer 440 can have the same or similar dimensions. In other embodiments, the interposer 440 can have the same or similar structure of the interposer 110 described above in conjunction with FIG. 1.

In some embodiments, the substrate 441 can include at least one TSV structure (not labeled). Connectors, e.g., bumps 445, can be electrically coupled with bumps 425a through the interposer 440. The substrate 441, the interconnect structures, and the TSV structures can be made of the same or similar materials of the substrate 113, the interconnect structure 119, and the TSV structures 115a, 115b, respectively, described above in conjunction with FIG. 1.

By disposing the interposer 440 between the interposer 410 and the integrated circuit 420, the pitch of the bumps 445 can be fanned out to the pitch of the pumps 435 through the interposers 440 and 410. The CTE mismatch of the integrated circuit 420 and the interposer 410 may be further reduced. In some embodiments, the interconnect structure 419 can extend at least partially over the molding compound material 417 as shown in FIG. 3. The molding compound material 417 can include TSV structures 315c shown in FIG. 3.

Figure 5:
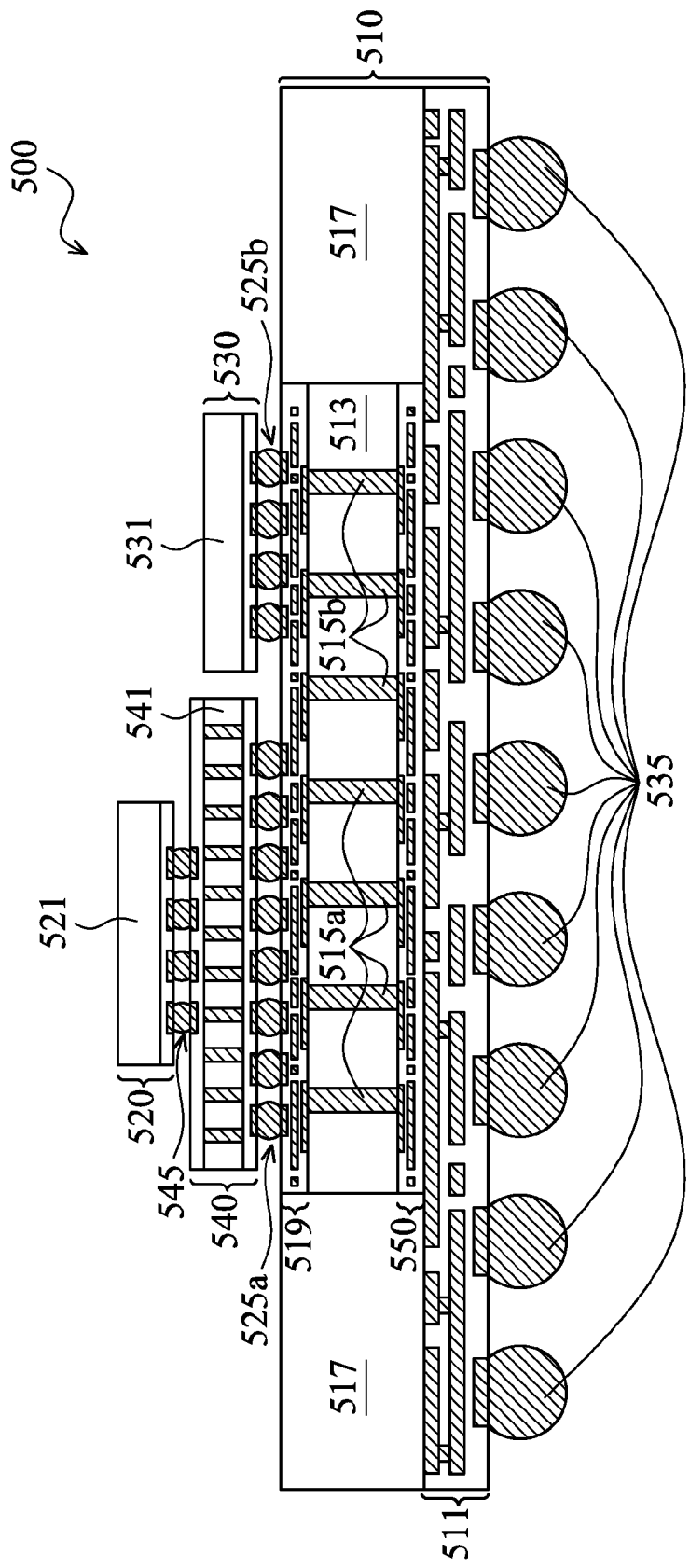
FIG. 5 is a schematic cross-sectional view of a fifth exemplary package system.

FIG. 5 is a schematic cross-sectional view of a fifth exemplary package system. Items of FIG. 5 that are the same or similar items in FIG. 4 are indicated by the same reference numerals, increased by 100. In FIG. 5, an interconnect structure 550 can be disposed between a substrate 513 and an interconnect structure 511. In some embodiments, the interconnect structure 550 can be made of the same or similar material of the interconnect structure 519. In other embodiments, the metallic line pitch of the interconnect structure 550 can be substantially equal to the metallic line pitch of the interconnect structure 519. The metallic line pitch of the interconnect structure 550 is then fanned out to the metallic line pitch of an interconnect structure 511. In still other embodiments, the metallic line pitch of the interconnect structure 550 is larger than the metallic line pitch of the interconnect structure 519 and is smaller than the metallic line pitch of the interconnect structure 511.

In some embodiments, the interconnect structure 519 can extend at least partially over the molding compound material 517 in the manner as interconnect structure 319 shown in FIG. 3. The molding compound material 517 can include TSV structures 315c shown in FIG. 3. In other embodiments, the interconnect structure 550 can also extend such that edges of the interconnect structure 550 adjacent the molding compound material 517 can be substantially aligned with edges of the interconnect structure 519.

Figure 6A:
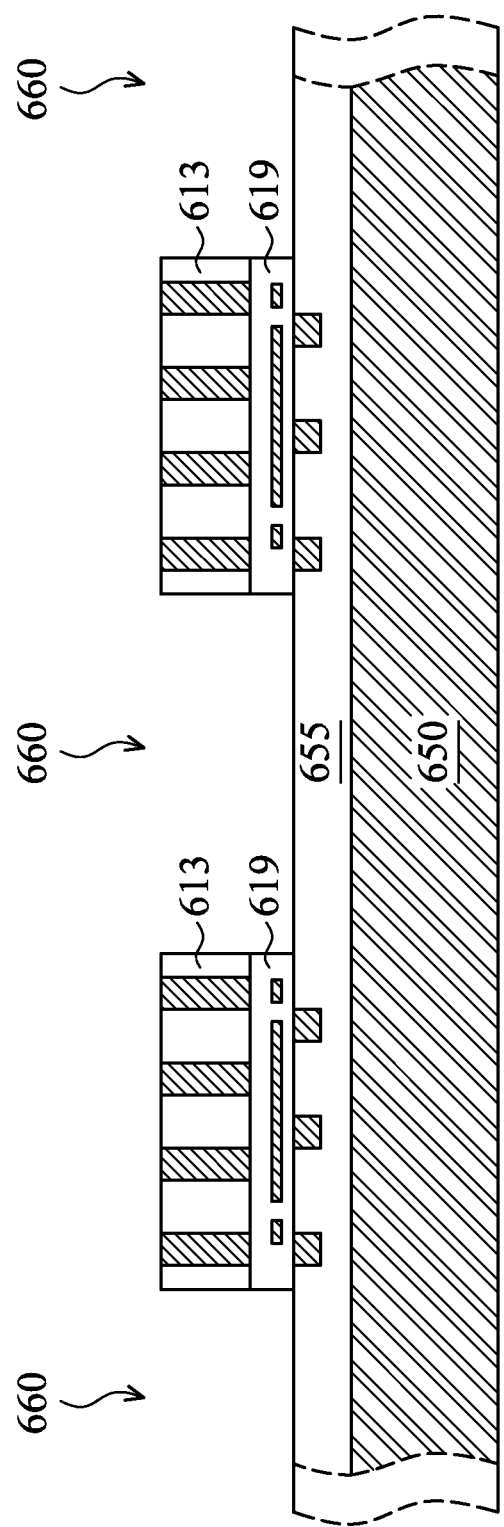
FIGS. 6A-6E are schematic cross-sectional views illustrating an exemplary method of forming a plurality of interposers.

FIGS. 6A-6E are schematic cross-sectional views illustrating an exemplary method of forming a plurality of interposers. Items of FIGS. 6A-6E that are the same or similar items in FIG. 1 are indicated by the same reference numerals, increased by 500. In FIG. 6A, a method of forming a plurality of interposers can include disposing a plurality of substrates 613 over a carrier 650, e.g., a glass substrate. The substrates 613 are separated from each other by spaces 660. In some embodiments, the substrates 613 can be attached on an adhesive layer 655 that is disposed over the carrier 650. The adhesive layer 655 can include a material such as a thermosetting resin to facilitate connection between the carrier 650 and the substrates 613.

In some embodiments, each substrate 613 can include a plurality of TSV structures (not labeled). In other embodiments, a plurality of interconnect structures 619 can each be disposed between the corresponding substrate 613 and the carrier 650. The interconnect structures 619 and the TSV structures can be formed before being disposed over the carrier 650. In some embodiments, the interconnect structures 619 and the TSV structures can be made by at least one of deposition processes, photolithographic processes, etch processes, chemical-mechanical polish (CMP) processes, cleaning process, other semiconductor processes, or any combinations thereof.

Figure 6B:
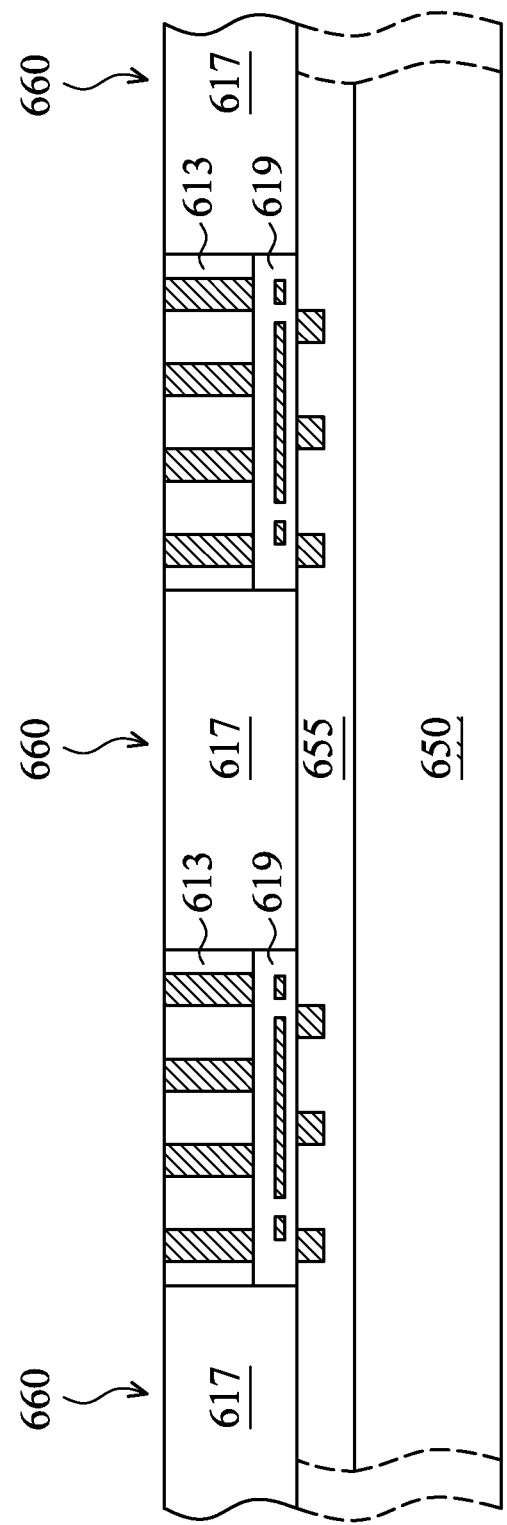

Referring to FIG. 6B, a molding compound material 617 can be formed in the spaces 660. In some embodiments, the molding compound material 617 is formed such that the surface (not labeled) of the molding compound material 617 can be substantially level with the surfaces of the substrate 617. In other embodiments, the molding compound material 617 can be formed, covering the substrates 613.

In some embodiments, a liquid or viscous molding compound can be applied in the spaces 660 and over the substrates 617 by any applicable equipment or methods. The portion of the liquid or viscous molding compound that is over the substrates 617 can be removed so as to form the molding compound material 617 in the spaces 660. In still other embodiments, after removing the portion of the molding compound, the liquid or viscous molding compound can be cured and/or hardened by any applicable thermal curing technique.

Figure 6C:
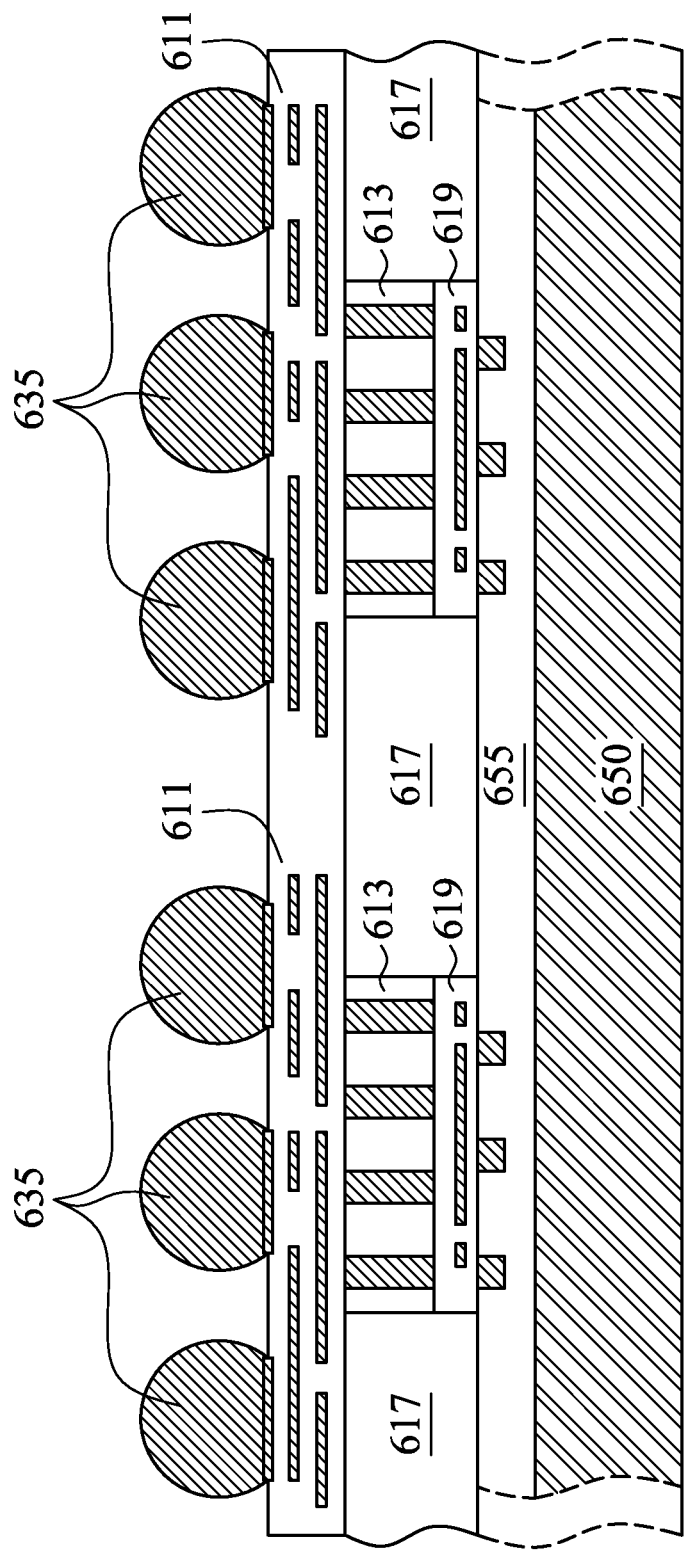

Referring to FIG. 6C, a plurality of interconnect structures 611 and bumps 635 can be formed over the substrates 613. Each of the interconnect structures 611 can be formed over the corresponding substrate 613. The bumps 635 can be electrically coupled with the TSV structures of the substrates 613 through the interconnect structures 611. The interconnect structures 611 can be formed, for example, by at least one of deposition processes, photolithographic processes, etch processes, chemical-mechanical polish (CMP) processes, cleaning process, other known semiconductor processes, or any combinations thereof.

In some embodiments, a plurality of pads (not labeled) can be formed between the interconnect structures 611 and the bumps 635. In other embodiments, the pads can be optionally subjected to an electroless nickel immersion gold (ENIG) process or an immersion tin (Im-Sn) process for forming ENIG or Im-Sn material on the exposed surfaces of the pads. The ENIG or Im-Sn material can serve as a bonding interface between the pads and the bumps 635.

Figure 6D:
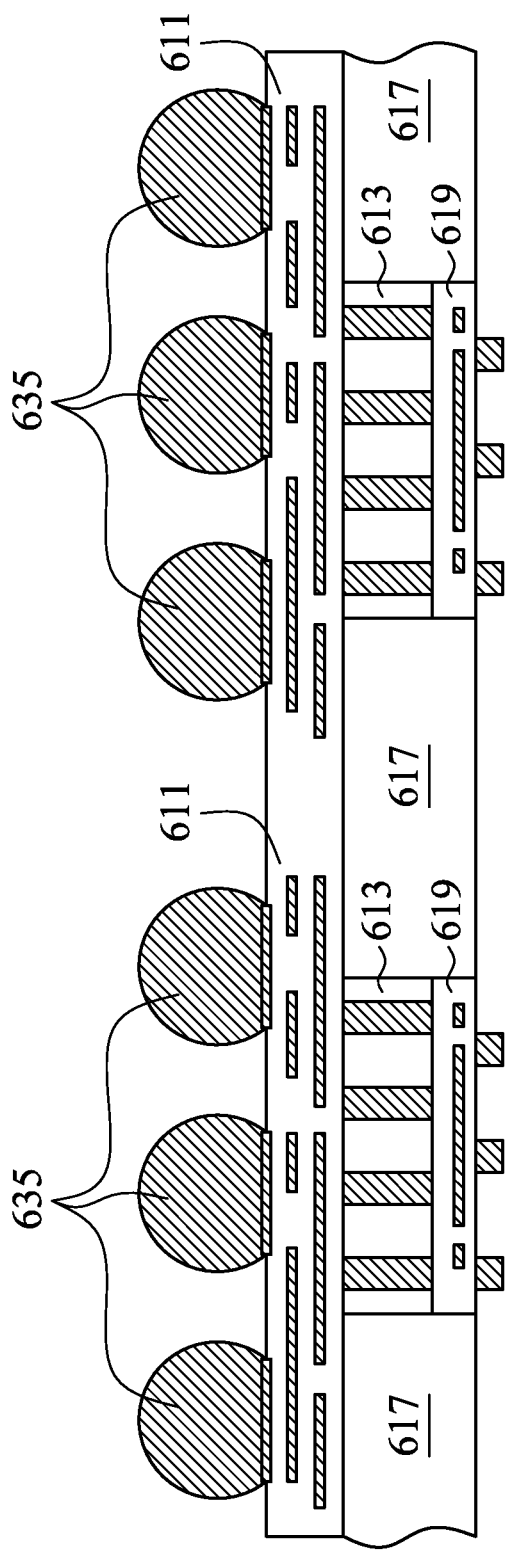

Referring to FIG. 6D, the carrier 650 (shown in FIG. 6C) can be removed from the substrates 613. In some embodiments, removing the carrier 650 can include removing the adhesive layer 655 that is disposed between the substrates 613 and the carrier 650. Removing the adhesive layer 655 can include a thermal process, a wet etch process, a dry etch process, other applicable processes for removing the adhesive layer 655, or any combinations thereof.

Figure 6E:
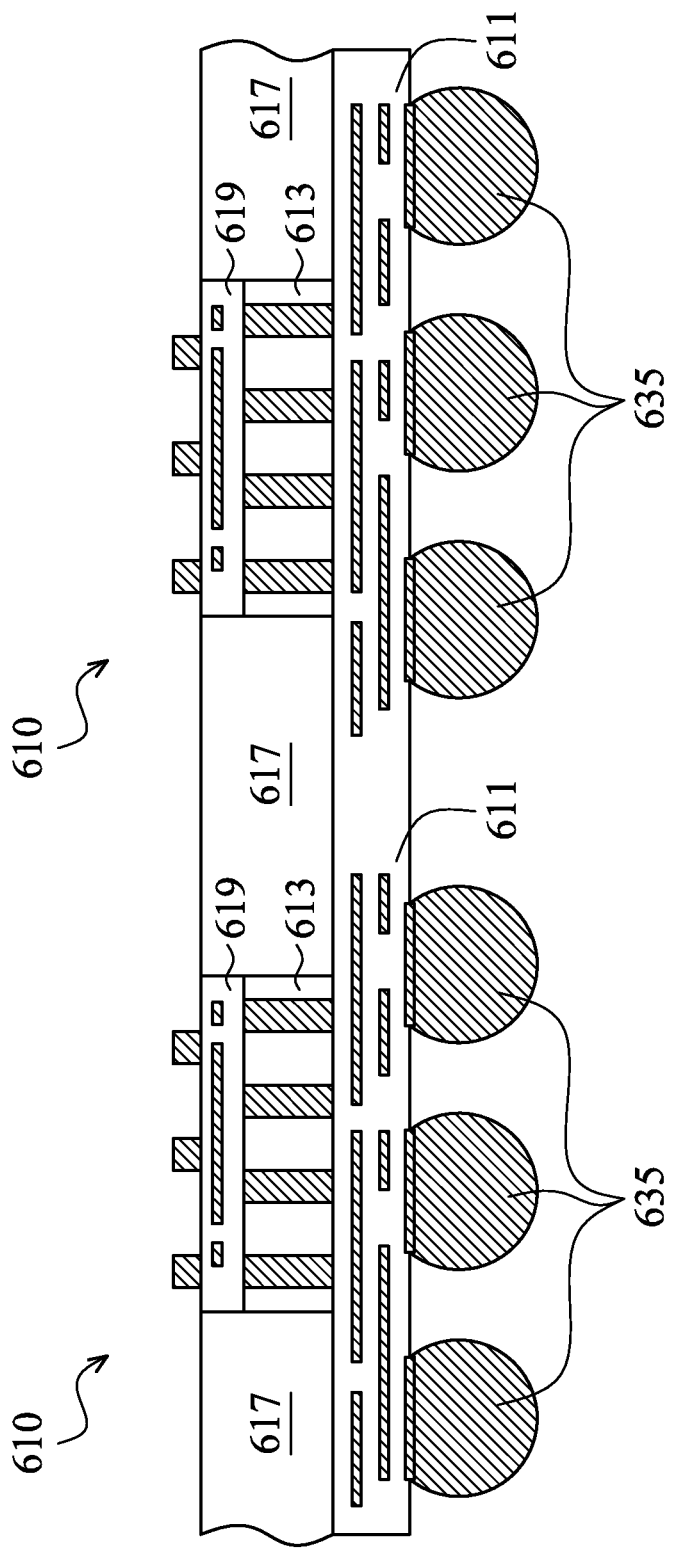

Referring to FIG. 6E, the structure shown in FIG. 6D can be subjected to a dicing process for dividing interposers 610. In some embodiments, the dicing process can include a blade sawing process and/or a laser sawing process. The dicing process can be performed along portions of the molding compound material 617 that is disposed in the spaces 660 (shown in FIG. 6A). After the dicing process, the molding compound material 617 can be formed and disposed around each of the substrates 613.

In some embodiments, at least one integrated circuit (not shown) can be disposed over each interposer 610 to form any package system described above in conjunction with FIGS. 1-5. It is noted that the number of the interposers 610 formed by the method described above in conjunction with FIGS. 6A-6E are merely exemplary. In some embodiments, more interposers 610 can be formed. It is also noted that the method described above in conjunction with FIGS. 6A-6E can be modified to achieve the interposers 210-510 described above in conjunction with FIGS. 2-5, respectively.

Figure 7:
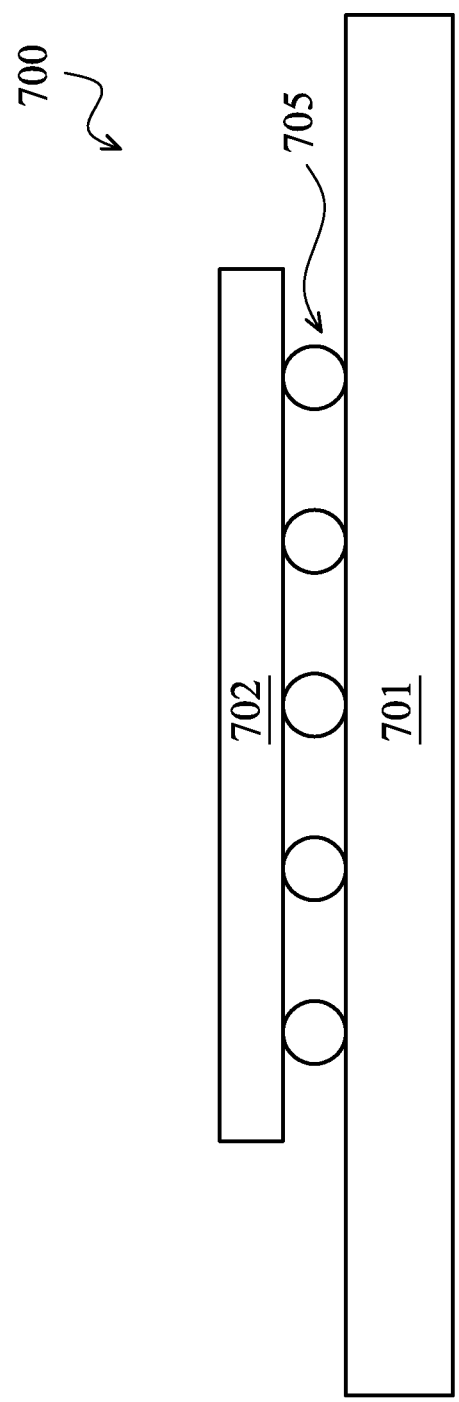
FIG. 7 is a schematic drawing illustrating a system including an exemplary package system disposed over a substrate board.

FIG. 7 is a schematic drawing illustrating a system including an exemplary package system disposed over a substrate board. In FIG. 7, a system 700 can include a package system 702 disposed over a substrate board 701. The substrate board 701 can include a printed circuit board (PCB), a printed wiring board and/or other carrier that is capable of carrying a package system. The package system 702 can be similar to one of the package system 100-500 described above in conjunction with FIGS. 1-5, respectively. The package system 702 can be electrically coupled with the substrate board 701. In some embodiments, the package system 702 can be electrically and/or thermally coupled with the substrate board 701 through bumps 705. The system 700 can be part of an electronic system such as displays, panels, lighting systems, auto vehicles, entertainment devices, or the like. In some embodiments, the system 700 including the package system 702 can provides an entire system in one IC, so-called system on a chip (SOC) or system on integrated circuit (SOIC) devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
   a first interposer comprising:
      a first interconnect structure;
      a first substrate disposed over the first interconnect structure, the first substrate comprising at least one first through silicon via (TSV) structure therein;
      a molding compound material disposed over the first interconnect structure and around the first substrate, the molding compound material being free of direct contact with any first TSV structure formed therein; and
      a second interconnect structure over the first substrate and having metallic lines and at least one dielectric layer; and
   a first integrated circuit disposed over the first interposer, the first integrated circuit being electrically coupled with the at least one first TSV structure through the second interconnect structure and connecting bumps,
   wherein
   a top surface of the molding compound material is flush with a top surface of the second interconnect structure, and
   a bottom surface of the molding compound material is flush with a bottom surface of the at least one first TSV structure.

2. The package system of claim 1, wherein the first integrated circuit comprises a second substrate, and a coefficient of thermal expansion (CTE) of the second substrate is substantially equal to a CTE of the first substrate.

3. The package system of claim 1, wherein a dimension of the first interconnect structure is larger than a dimension of the second interconnect structure.

4. The package system of claim 1, wherein the molding compound material further comprises:
   at least one through via disposed outside the first substrate and surrounded by the molding compound material, wherein a portion of the second interconnect structure extends over at least a portion of the molding compound material and electrically couples with the at least one through via.

5. The package system of claim 1, further comprising:
   a second integrated circuit disposed over the first interposer, wherein the second integrated circuit is electrically coupled with the at least one first TSV structure, the second integrated circuit comprises a third substrate, and a CTE of the third substrate is substantially equal to a CTE of the first substrate.

6. The package system of claim 1, further comprising:
   a second interposer disposed between the first integrated circuit and the first interposer, wherein the second interposer comprises at least one third TSV structure, and the at least one third TSV structure is electrically coupled with the first integrated circuit and the at least one first TSV structure.

7. A package system comprising:
   a first interposer comprising:
      a first interconnect structure, wherein the first interconnect structure has a first metallic line pitch;
      a first substrate disposed over the first interconnect structure, the first substrate comprising at least one first through silicon via (TSV) structure therein;
      a molding compound material disposed over the first interconnect structure and around the first substrate; and a second, substantially planar interconnect structure disposed over the first substrate, wherein the second interconnect structure has a second metallic line pitch that is smaller than the first metallic line pitch; and a first integrated circuit disposed over the first interposer, the first integrated circuit being electrically coupled with the at least one first TSV structure through the second interconnect structure and connecting bumps, wherein the first interposer further comprises:
a molding compound layer between the first interconnect structure and the first substrate, wherein the at least one first TSV structure is disposed through the molding compound layer.

8. The package system of claim 7, wherein the first integrated circuit comprises a second substrate, and a coefficient of thermal expansion (CTE) of the second substrate is substantially equal to a CTE of the first substrate.

9. The package system of claim 7, wherein the molding compound material further comprises:
at least one through via disposed outside the first substrate and surrounded by the molding compound material, wherein a portion of the second interconnect structure extends over at least a portion of the molding compound material and electrically couples with the at least one through via.

10. The package system of claim 7, further comprising:
a second integrated circuit disposed over the first interposer, wherein the second integrated circuit is electrically coupled with the at least one first TSV structure, the second integrated circuit comprises a third substrate, and a CTE of the third substrate is substantially equal to a CTE of the first substrate.

11. The package system of claim 7, further comprising:
a second interposer disposed between the first integrated circuit and the first interposer, wherein the second interposer comprises at least one third TSV structure, and the at least one third TSV structure is electrically coupled with the first integrated circuit and the at least one first TSV structure.

12. A package system, comprising:
a first interposer comprising:
a first interconnect structure;
a first substrate disposed over the first interconnect structure, the first substrate comprising at least one first through silicon via (TSV) structure therein, wherein the first substrate has a first coefficient of thermal expansion (CTE);
a second, substantially planar interconnect structure disposed over the first substrate and having metallic lines and at least one dielectric layer; and a molding compound material disposed over the first interconnect structure and surrounding the first substrate and the second interconnect structure; and a first integrated circuit disposed over the first interposer, the first integrated circuit being electrically coupled with the at least one first TSV structure through the second interconnect structure and connecting bumps, wherein the first integrated circuit comprises a second substrate, the second substrate has a second CTE, and the second CTE is substantially equal to the first CTE, wherein the first interposer further comprises:
a molding compound layer between the first interconnect structure and the first substrate, wherein the at least one first TSV structure is disposed through the molding compound layer.

13. The package system of claim 12, wherein a dimension of the first interconnect structure is larger than a dimension of the second interconnect structure.

14. The package system of claim 12, wherein the molding compound material further comprises:
at least one through via disposed in the molding compound material, wherein a portion of the second interconnect structure extends over at least a portion of the molding compound material and electrically couples with the at least one through via.

15. The package system of claim 12, further comprising:
a second integrated circuit disposed over the first interposer, wherein the second integrated circuit is electrically coupled with the at least one first TSV structure, the second integrated circuit comprises a third substrate, and a CTE of the third substrate is substantially equal to a CTE of the first substrate.

16. The package system of claim 12, further comprising:
a second interposer disposed between the first integrated circuit and the first interposer, wherein the second interposer comprises at least one third TSV structure, and the at least one third TSV structure is electrically coupled with the first integrated circuit and the at least one first TSV structure.

17. The package system of claim 1, wherein
the first interconnect structure comprises metallic lines having a first metallic line pitch, and
the second interconnect structure has a second metallic line pitch smaller than the first metallic line pitch.

18. The package system of claim 5, wherein the second integrated circuit is at least partially co-elevational with the first integrated circuit in a thickness direction of the first interposer.

19. The package system of claim 12, wherein a top surface of the molding compound material is flush with a top surface of the second interconnect structure.

* * * * *